(12) United States Patent
Ulkuniemi et al.

(10) Patent No.: US 12,170,436 B2
(45) Date of Patent: Dec. 17, 2024

(54) METHOD FOR FABRICATING SEMICONDUCTOR DEVICE

(71) Applicant: Modulight Corporation, Tampere (FI)

(72) Inventors: Riina Ulkuniemi, Tampere (FI); Ville Vilokkinen, Tampere (FI); Petri Melanen, Tampere (FI)

(73) Assignee: Modulight Oy, Tampere (FI)

( * ) Notice: Subject to any disclaimer, the term of this patent is extended or adjusted under 35 U.S.C. 154(b) by 402 days.

(21) Appl. No.: 17/569,055

(22) Filed: Jan. 5, 2022

(65) Prior Publication Data

US 2023/0216278 A1 Jul. 6, 2023

(51) Int. Cl.
*H01L 21/00* (2006.01)
*H01L 21/20* (2006.01)
(Continued)

(52) U.S. Cl.
CPC ............ *H01S 5/2272* (2013.01); *H01L 21/20* (2013.01); *H01S 5/2086* (2013.01); *H01S 5/2224* (2013.01); *H01S 5/2275* (2013.01)

(58) Field of Classification Search
CPC ........... H01L 21/0243; H01L 21/76877; H01L 21/02183; H01L 21/31111; H01S 5/2272;
(Continued)

(56) References Cited

U.S. PATENT DOCUMENTS 4,215,319 A 7/1980 Botez
5,915,187 A * 6/1999 Huisman ................. H01L 29/93
438/505

(Continued)

FOREIGN PATENT DOCUMENTS

CN 113422294 A 9/2021
EP 0136097 A2 4/1985
(Continued)

OTHER PUBLICATIONS

European Patent Office, Notification of Transmittal of the International Search Report and Written Opinion of the International Searching Authority, or the Declaration; Application No. PCT/FI2022/050815, mailed Mar. 17, 2023; 17 pages.
(Continued)

*Primary Examiner* — Nikolay K Yushin
(74) *Attorney, Agent, or Firm* — Ziegler IP Law Group LLC.

(57) ABSTRACT

A method for fabricating a semiconductor device on a semiconductor substrate, wherein the semiconductor device is adapted to provide target lasing properties, the method includes creating, a mask layer over the semiconductor substrate, the mask layer having at least one opening to expose a region of the semiconductor substrate, etching using a first etching process the exposed region, utilizing inductively coupled plasma with preselected first set of parameters to obtain a baseline mesa profile, the baseline mesa profile having a baseline mesa angle, re-etching using a second etching process the etched region, utilizing inductively coupled plasma with preselected second set of parameters, to alter the baseline mesa profile to obtain a requisite mesa profile having a requisite mesa angle defined by the target lasing properties and the requisite mesa angle being different from the baseline mesa angle, removing the mask layer and defining a p-n junction for the semiconductor substrate.

14 Claims, 7 Drawing Sheets

(51) Int. Cl.
  *H01S 5/20* (2006.01)
  *H01S 5/22* (2006.01)
  *H01S 5/227* (2006.01)
(58) Field of Classification Search
  CPC .......... H01S 5/227; H01S 5/2086; H01S 5/20; H01S 5/2224; H01S 5/22; H01S 5/2275; H01S 5/2234; H01S 5/223; H01S 5/2277
  See application file for complete search history.

(56) References Cited

U.S. PATENT DOCUMENTS

| | | | |
|---|---|---|---|
| 10,134,591 B2 * | 11/2018 | Sun | H01L 21/02463 |
| 2023/0103045 A1 * | 3/2023 | Agnello | C09K 13/04 428/141 |

FOREIGN PATENT DOCUMENTS

| | | |
|---|---|---|
| EP | 0793266 A2 | 9/1997 |
| JP | S62126685 A | 6/1987 |
| JP | H0239483 A | 2/1990 |
| JP | 2008172101 A | 7/2008 |

OTHER PUBLICATIONS

Lin Jie et al, Smooth and vertical-sidewall InP etching using C12/N2 inductively coupled plasma, Journal of Vacuum Science and Technology B Microelectronicsprocessing and phenomena, Mar. 1, 2004, vol. 22, No. 2, American Vacuum Society, New York, NY, USA, 4 pages.

* cited by examiner

METHOD FOR FABRICATING SEMICONDUCTOR DEVICE

TECHNICAL FIELD

The present disclosure relates to fabrication of semiconductor devices; and more specifically to a method for fabricating a semiconductor device on a semiconductor substrate.

BACKGROUND

Fabrication methods that are employed to tailor surface properties of semiconductors have become increasingly important as new applications for semiconductor-based materials continue to be developed. Typically, a semiconductor device such as a semiconductor laser is fabricated from semiconductor wafers or substrates, wherein a designated structure is formed via one or more epitaxial methods such as, for example, a metal organic chemical vapor deposition (MOCVD) method. Generally, the formed structure comprises a p/n-junction with active region on top of a substrate wafer. Upon proper fabrication of the semiconductor substrate to laser chips, a current is driven through the pn-junction for lasing or laser formation.

If only current determines where gain is obtained, device is called a gain-guided laser. It is also possible to enhance gain properties by index-guiding, where optical field is confined with refractive index difference is generated near the active region. This can be implemented by etching a ridge/mesa structure to the semiconductor after epitaxial growth (for example, in Ridge Waveguide (RWG) laser), or it can be done as a part of the epitaxial growth, in which case the ridge is surrounded by other semiconductor material. For best operating properties, sides of the ridge have to be covered with insulating material to ensure proper gain-guiding with current, i.e., only top of the ridge has to be uninsulated. This is usually done by depositing the insulating layer on the whole wafer, then doing photolithographic steps for etching the top of the ridge open. This, in turn, is achieved by leaving stripe with width of the ridge or less exposed to etching, and everything else being covered by photoresist, protecting the region where insulation is needed. After this step, metal is deposited on top of the ridges. Since only the top of the ridge is opened, when the current is driven to the device, the current goes through the semiconductor structure only through the ridge.

In the fabrication of mesa-type and similar semiconductor devices, one of the main problems is that of making an electrical contact to the mesa or other protuberance, which is usually very small and protrudes only a few micrometres above the relatively larger area of a surface of the remainder of the semiconductor body. For instance, when fabricating single-mode RWG lasers, ridge width has to be narrow (~1-3 μm, depending on operating wavelength) to ensure the single-mode operation. Due to the narrow widths of the ridge, alignment tolerances are really low. Further, existing semiconductor fabrication techniques are not self-aligning and alignment lithography is required to ease the strict alignments or prevent misalignment of the open mask for further preventing non-symmetric opening of the ridge in which the insulating material covers the ridge partly from one side and exposes ridge side too much from the other side causing current leakage, electrical losses and distortion in the optical field output. Furthermore, insulating material residuals on top of the ridge may cause mechanical issues in cleaving due to the height difference on top of the ridge and also cause non-continuity to of the contact surface on top and reducing the efficiency of operation or yield losses in laser diode processes.

Moreover, in silicon photonics, that offers a platform to build mass-producible optical circuits, such that the interest to develop suitable coupling strategies is increased. One of the most important aspects of silicon photonics is the ability to provide extremely small optical components having dimensions of the order of a magnitude smaller than optical fibre devices. Such a dimension difference makes the design of fiber-to-chip interfaces challenging and, over the years, has stimulated considerable technical and research efforts in the field.

Therefore, in light of the foregoing discussion, there exists a need to overcome the aforementioned drawbacks associated with existing fabrication techniques and provide an improved method for fabricating semiconductor devices.

SUMMARY

The present disclosure seeks to provide a method for fabricating a semiconductor device on a semiconductor substrate, wherein the semiconductor device is adapted to provide target lasing properties. An aim of the present disclosure is to provide a solution that overcomes at least partially the problems encountered in prior art.

In one aspect, an embodiment of the present disclosure provides a fabricating a semiconductor device on a semiconductor substrate, wherein the semiconductor device is adapted to provide target lasing properties, the method comprising:

creating, a mask layer over the semiconductor substrate, the mask layer having at least one opening to expose a region of the semiconductor substrate;

etching using a first etching process the exposed region, utilizing inductively coupled plasma with preselected first set of parameters to obtain a baseline mesa profile, the baseline mesa profile having a baseline mesa angle;

re-etching using a second etching process the etched region, utilizing inductively coupled plasma with preselected second set of parameters, to alter the baseline mesa profile, the second set of parameters being different from the first preselected parameters, to obtain a requisite mesa profile having a requisite mesa angle defined by the target lasing properties and the requisite mesa angle being different from the baseline mesa angle;

removing the mask layer; and defining a p-n junction for the semiconductor substrate.

In another aspect, an embodiment of the present disclosure provides a semiconductor device adapted to provide desired lasing properties fabricated using the method.

Embodiments of the present disclosure substantially eliminate or at least partially address the aforementioned problems in the prior art and provide an improved method for fabricating a semiconductor device on a semiconductor substrate, wherein the semiconductor device is adapted to provide target lasing properties.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

Figure 1:
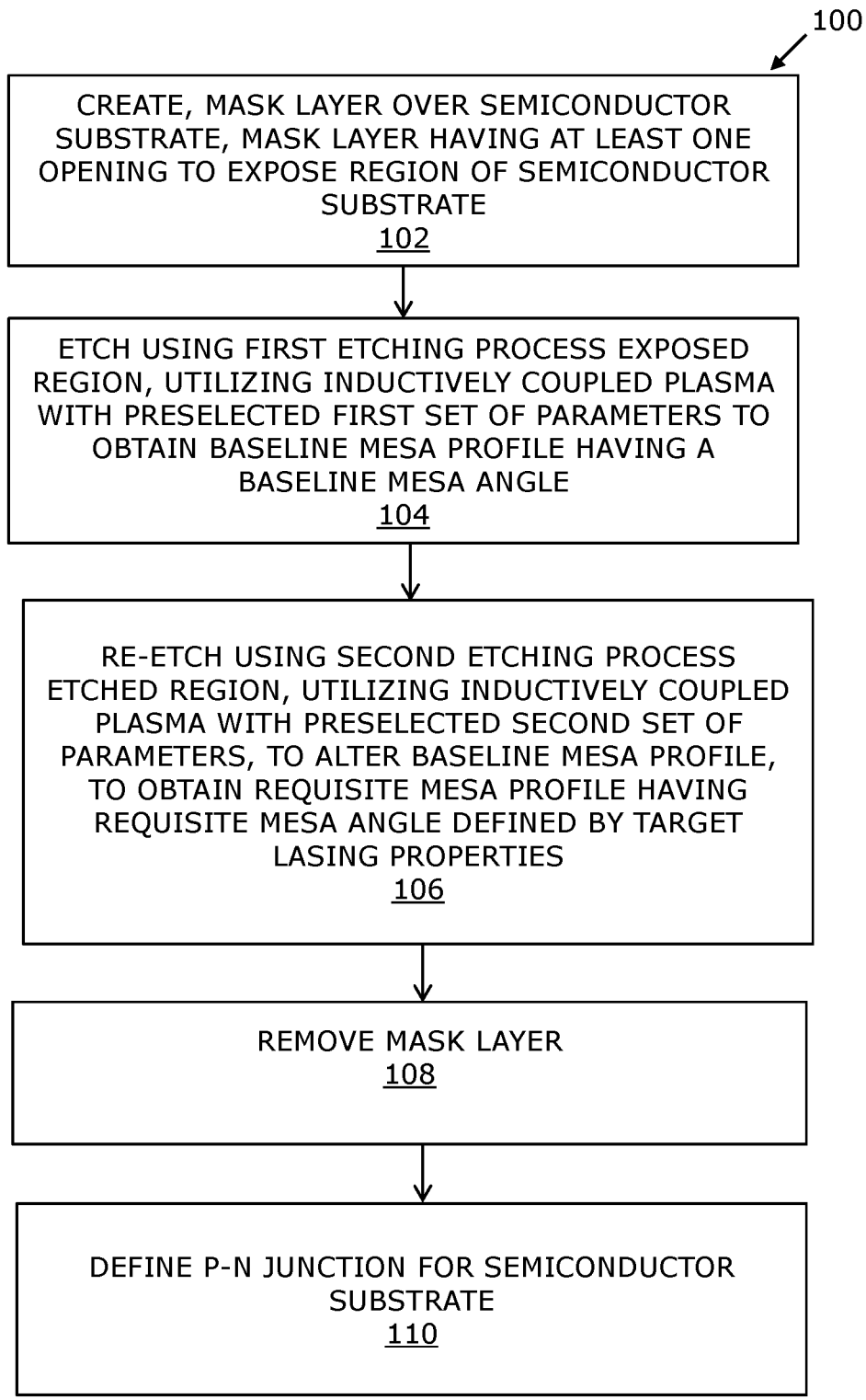
FIG. 1 is a flowchart listing steps involved in a method for fabricating a semiconductor device on a semiconductor substrate, in accordance with an embodiment of the present disclosure.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In one aspect, an embodiment of the present disclosure provides a fabricating a semiconductor device on a semiconductor substrate, wherein the semiconductor device is adapted to provide target lasing properties, the method comprising:
creating, a mask layer over the semiconductor substrate, the mask layer having at least one opening to expose a region of the semiconductor substrate;
etching using a first etching process the exposed region, utilizing inductively coupled plasma with preselected first set of parameters to obtain a baseline mesa profile, the baseline mesa profile having a baseline mesa angle;
re-etching using a second etching process the etched region, utilizing inductively coupled plasma with preselected second set of parameters, to alter the baseline mesa profile, the second set of parameters being different from the first preselected parameters, to obtain a requisite mesa profile having a requisite mesa angle defined by the target lasing properties and the requisite mesa angle being different from the baseline mesa angle;
removing the mask layer; and
defining a p-n junction for the semiconductor substrate.

In another aspect, an embodiment of the present disclosure provides a semiconductor device adapted to provide desired lasing properties fabricated using the method.

In an aspect, the present disclosure provides a method for fabricating a semiconductor device on a semiconductor substrate. The present method is configured to allow output beam engineering of the semiconductor device suitable for different applications, such as silicon photonics. Herein, the term "semiconductor substrate" refers to a layer or block of a material upon or within which elements of a semiconductor device are fabricated or attached. For example, the semiconductor substrate may be formed using at least one of silicon (Si), gallium (Ga), germanium (Ge), arsenic (As) and elements such as, nitrogen (N), carbon (C) and so forth or a combination of two or more of these materials such as, but not limited to, silicon carbide (SiC), gallium nitride (GaN), gallium arsenide (GaAs) or sapphire. Notably, the semiconductor substrate may be a layer of any metallic, non-metallic, semiconductor material or a combination of the metallic, non-metallic and semiconductor material, a layer of any material deposited on a supporting structure or the supporting structure itself. In present examples, the semiconductor substrate may be GaAs or Indium phosphide (InP), based substrate which is suitable for forming HEMT and MESFET structures. However, the semiconductor substrate may be formed of any material on which it is desired to produce a sub-half micron pattern in accordance with the present disclosure. The semiconductor substrate may be formed using a variety of conventional techniques depending on the semiconductor device, integrated circuit or electronic structure to be formed, including such techniques as molecular beam epitaxy or metal-organic chemical vapor deposition. The particular construction of the substrates used in connection with the practice of the disclosed embodiments will not be further described since its application in connection with the present disclosure will be understood by those skilled in the art.

The semiconductor device is fabricated using the semiconductor substrate by implementing the method of the present disclosure, and thereby achieves all features and advantages of the present disclosure. Herein, the "semiconductor device" refers to an electronic component comprising of a semiconductor material such as, but not limited to, silicon, germanium, and gallium arsenide, as well as organic semiconductors. Generally, the semiconductor devices are manufactured both as a single discrete device and as an integrated circuit (IC) chip consisting of two or more electronic devices and interconnected on a single semiconductor substrate. Examples of semiconductor devices include transistors, diodes, light-emitting diodes (LEDs), solar cells, laser diode and so forth.

In an embodiment, the semiconductor device is a laser device. The "laser device" or "semiconductor laser" refers to a device configured for laser oscillation by flowing an electric current to the semiconductor device. The mechanism of light emission is the same as a light-emitting diode (LED). Herein, the laser generates light by flowing the forward current such as, to a p-n junction. In an exemplary forward bias operation, the p-type layer is connected with the positive terminal and the n-type layer is connected with the negative terminal, such that the electrons enter from the n-type layer and holes from the p-type layer, respectively. Upon contact at the p-n junction of the semiconductor device or laser, an electron drops into a hole and correspondingly light is emitted at the contact surface.

Typically, the semiconductor device being fabricated on the semiconductor substrate is adapted to provide target lasing properties. The term "lasing properties" refer to the spectral emission properties and/or characteristics of the laser being produced by the semiconductor device. The target lasing properties of the semiconductor device are adapted based on the implementation by varying the inputs such as, the input current, voltage, power, cavity spacing, and the like to provide a desired lasing action of the semiconductor device. For example, the target lasing properties adapted based on the method implementation include, but are not limited to, beam strength, frequency, wavelength, bandwidth, intensity, brightness, mode of operation, and the like. In an example, the semiconductor device is configured to adapt or alter the effective waveguide strength with a two-step etching process to enable the method to beneficially allow modifying a far-field of the semiconductor device.

The method comprises creating, a mask layer over the semiconductor substrate, the mask layer having at least one opening to expose a region of the semiconductor substrate. Typically, the mask layer or mask is created on top of the semiconductor substrate to cover the surface of semiconductor substrate. Herein, the term "mask" refers to an opaque plate having openings, holes, or transparencies formed therein to allow exposure in a defined pattern. For example, the mask is a photomask (i.e., positive or negative) or a hard mask. The term "at least one opening" refers to one or more open or uncovered volumes in the mask layer exposing the region beneath thereof. The "treatment process" refers to a type of technique or procedure employed to remove a portion of the mask layer material to form the at least one opening. For example, the first treatment process is an ultra-violet (UV) radiation technique. The term "UV radiation" is to be understood in principle as meaning all electromagnetic radiation which adjoins the short-wave part of the visible light, as a rule with a wavelength of less than 380 nm. This UV light is preferably so-called Medium-wave UV (UV-B) with wavelengths between about 280 nm to about 315 nm and short-wave UV (UV-C) with wavelengths of about 100 nm to 280 nm. As discussed, in an example, the mask layer is a positive photoresist diazonaphthoquinone (DNQ)-novolac formed using combination of photoresist materials DNQ and novolac, in which the positive photoresist material is configured to be developed by dissolution in a basic solution of tetramethylammonium hydroxide (TMAH) in water. This removes the unwanted volume of the mask layer up to its thickness to form the at least one opening, and thereby exposing the region beneath thereof.

Optionally, the creation of the mask layer comprises deposition of the mask layer over the entire semiconductor substrate, wherein the deposited mask layer is further treated on a specific portion to form the at least one opening therein. Upon deposition of the mask layer, the mask layer is treated using a treatment process such as, photoetching, wherein the at least one opening is formed in the mask layer to expose a region beneath thereof. Notably, the pattern for the mask is defined by (or complementary to) the at least one opening, such that the mask covers the semiconductor substrate other than the defined at least one opening. Herein, treating the mask layer using the photoetching treatment process comprises utilization of UV light. Based on the applied treatment pattern on the mask layer, the at least one opening is formed or exposed with the UV light. The exposure to the UV light activates the photoactive compound in the treated region of the mask layer and makes it soluble to photoresist developers.

In an embodiment, the mask layer is one of a photoresist mask layer or a hard mask layer, wherein based on the applied mask layer a suitable treatment process such as photoetching, chemical etching may be employed to further fabricate the semiconductor device.

The method further comprises etching using a first etching process the exposed region, utilizing inductively coupled plasma with preselected first set of parameters to obtain a baseline mesa profile, the baseline mesa profile having a baseline mesa angle. Herein, the first etching process involves utilization of inductively coupled plasma (ICP) with the preselected first set of parameters to obtain base line mesa profile, wherein the plasma etching may be one of a dry etching or a wet etching process. In an example, inductively coupled plasma system using $BCl_3/Cl_2$ gas may be employed for dry plasma etching. In another example, $HCl:H_3PO_4$ based solution is used for the wet etching. The term "mesa" or "mesa structure" (also, sometimes, referred to as "ridge") relates to the position or configuration (such as a ridge-like structure) of a structure formed via the first etching process on the semiconductor substrate and thus forming at least a top (i.e., covered via the mask layer) and sides (being etched using the first etching process), in which the top of the mesa structure is at an elevated level with respect to the mesa. The term "baseline mesa profile" refers to a configuration or shape (or curvature) of the mesa structure formed upon utilization of the first etching process with the preselected first set of parameters on the semiconductor substrate, wherein the baseline mesa profile enables baseline lasing properties (different from the target lasing properties). The "pre-selected first set of parameters" refer to the plurality of configurable parameters of the first etching process that are selected to form the required baseline mesa profile. The pre-selected first set of parameters include, but are not limited to, current, voltage, power, temperature, frequency or wavelength, intensity and so forth may be varied to be suitable for and/or according to the semiconductor substrate material.

Typically, the baseline mesa profile comprises the baseline mesa angle i.e., the angle formed between any side of the mesa structure and an exposed bottom region formed between any two adjacent mesa structures. The baseline mesa angle varies in a range of 90 degrees (denote as °) to 180 degrees. For example, the baseline mesa profile comprises the baseline mesa angle from 90°, 91, 92, 93, 95°, 100°, 105°, 110°, 115°, 130°, 145°, 160° up to 100°, 105°, 110°, 115°, 130°, 145°, 160°, 175°, 177, 178, 179°. The preselected first set of parameters are pre-configured for the formation of the baseline mesa profile in a quick and time efficient manner and involves removal of a majority of the portion required to be etched in the method of the present disclosure. Consequently, the etched portion i.e., majority of the portion removed via the etching process forms a cavity between each pair of mesa structures. Beneficially, the cavity formed i.e., a resonant cavity for the semiconductor substrate and/or device and may be beneficially employed to enable the method to efficiently achieve the target lasing properties and thereby improve the efficacy of the method. Further, the first etching process enables controlling the plasma quality over the semiconductor substrate via the equipment and eliminating or reducing the dependence of an operator. Beneficially, the controlled plasma etching enables forming the baseline mesa profile through the exposed region in a precise and controlled manner such that the desired baseline mesa angle is achieved in a time efficient manner and improves the overall efficiency of the method.

In an exemplary implementational scenario, the baseline mesa profile of 117° is etched using the first etching process i.e., ICP-RIE process on the exposed region, utilizing inductively coupled plasma with preselected first set of parameters comprising at least one of an ICP power, a RIE power and an operating pressure. The method beneficially varies the preselected first set of parameters based on the requirements of the implementation to efficiently etch the baseline mesa profile.

Optionally, the ICP power for the first etching process may vary from 250 watts to 1500 watts (W). In an example, the ICP power may be selected from the range of 250 W, 300 W, 350 W, 400 W, 500 W, 600 W, 650 W, 700 W up to 500 W, 550 W, 600 W, 650 W, 700 W, 800 W, 900 W, 1000 W, 1100 W, 1200 W, 1250 W.

Optionally, the RIE power for the first etching process may vary from 50 watts to 350 watts (W). In an example, the RIE power may be selected from the range of 50 W, 60 W, 75 W, 100 W, 150 W, 200 W, 250 W, 300 W up to 60 W, 75 W, 90 W, 100 W, 150 W, 200 W, 250 W, 300 W, 350 W.

Optionally, the operating pressure for the first etching process may vary from 2 millitorrs to 20 millitorrs (mTorr). In an example, the operating pressure may be selected from the range of 2 mTorr, 2.5 mTorr, 3 mTorr, 3.5 mTorr, 4 mTorr, 4.5 mTorr, 5 mTorr up to 6 mTorr, 7 mTorr, 7.5 mTorr, 10 mTorr, 15 mTorr, 20 mTorr.

In an example, the semiconductor substrate is treated or etched for a period of 15 minutes, such that the baseline mesa profile may be formed. Beneficially, the etching process enables in developing or removing the semiconductor substrate material in a controlled manner, in which the etch rate may be defined and controlled precisely to ensure that only thickness up to a desired depth is removed.

In an embodiment, the preselected first set of parameters are selected based, at least in part, to obtain the baseline mesa profile having a predefined depth. The first etching process utilizing the ICP with the preselected first set of parameters are selected based, at least in part, to obtain the baseline mesa profile having the predefined depth. The term "predefined depth" refers to the thickness of the semiconductor substrate material removed from the semiconductor substrate i.e., the distance between the top of the mesa structure and the exposed bottom region formed upon utilization of the first etching process. Notably, the predefined depth of the etched semiconductor substrate is beneficially varied based on the implementation to obtain an optimum configuration of the semiconductor device based on a plurality of factors including, but not limited to, semiconductor substrate material, semiconductor substrate structure, and the like. Moreover, the predefined depth is based on a plurality of factors including, but not limited to, mode of operation, threshold current, energy consumption and so forth and thus, the predefined depth is configured considering that a shallow etching involves a very high threshold current and consequently increases the energy consumption of the semiconductor device, whereas a deep etching may cause mode of operation issues (i.e., does not enable single-mode operation). Thus, the predefined depth is configured based on the aforementioned factors and consequences, and may vary in a range of, but not limited to, 900 nanometres (nm) to 2000 nm. For example, the predefined depth lies in the range of 900 nm, 950 nm, 1000 nm, 1100 nm, 1200 nm, 1300 nm, 1400 nm, 1500 nm, 1625 nm up to 1100 nm, 1200 nm, 1300 nm, 1400 nm, 1500 nm, 1625 nm, 1750 nm, 1875 nm, 2000 nm. In an exemplary scenario, the first etching process utilizing the ICP with the preselected first set of parameters comprises removal of the semiconductor substrate to form the baseline mesa profile having a predefined depth of 1200 nm and a baseline mesa angle of 120°. Beneficially, the first etching process defines the predefined depth and the baseline mesa angle in a time efficient manner such that further precise modifications may be made to the semiconductor substrate as per the implementation at a later stage of the method. Optionally, the first etching process may be done via reactive ion etching (RIE) process without affecting the functionality or limiting the scope, of the disclosure.

The method further comprises re-etching using a second etching process the etched region, utilizing the inductively coupled plasma with preselected second set of parameters, to alter the baseline mesa profile, the second set of parameters being different from the first preselected parameters, to obtain a requisite mesa profile having a requisite mesa angle defined by the target lasing properties and the requisite mesa angle being different from the baseline mesa angle. The re-etching of the semiconductor substrate is done to provide precise and accurate modifications to the baseline mesa profile and thus, alter the baseline mesa profile utilizing the inductively coupled plasma with the preselected second set of parameters to obtain the requisite mesa profile having the requisite mesa angle. Typically, the preselected second set of parameters enable provision of the required modifications or alterations to the baseline mesa profile to provide the requisite mesa profile having the requisite mesa angle. Notably, the requisite mesa angle is lesser than the baseline mesa angle. Herein, the slope of the sides of the mesa structure are re-etched using the second etching process to reduce the slope of the sides of the mesa structure and provide the requisite mesa angle defining the requisite mesa profile. Beneficially, such an implementation of a dual etching process i.e., etching using the first etching process with the preselected first set of parameters and re-etching using the second etching process with the preselected second set of parameters, reduces the overall time taken by the method for achieving the requisite mesa profile having the requisite mesa angle. Optionally, the second etching process may be done via reactive ion etching (RIE) process without affecting the functionality or limiting the scope, of the present disclosure.

In an exemplary scenario, the second etching process utilizing the ICP with the preselected second set of parameters comprises removal of the semiconductor substrate material to form a requisite mesa profile having a requisite mesa angle of 115° and a predefined depth of 1200 nm, from a baseline mesa profile and having a baseline mesa angle of 120° and a predefined depth of 1200 nm. Notably, predefined depth is retained or kept constant during the re-etching process, however, it will be appreciated the predefined depth may be varied at least partially based on the implementation without limiting the scope of the disclosure. In an example, the predefined depth is 1100 nm. In another example, the predefined depth is 1000 nm. In yet another example, the predefined depth is 1300 nm. Moreover, the dual etching process improves the efficiency of the method and enables the method to engineer a far-field target employing the re-etched semiconductor substrate having the requisite mesa profile in a faster and efficient manner. For example, the first etching process results in an X° horizontal far-field of the semiconductor device formed using the etched semiconductor substrate. laser. In such a scenario, if for any application, a Y° horizontal far-field of the semiconductor device is required, instead of optimizing the whole conventional etching process (i.e., single etching), which would normally be required, utilizing this dual etching process enables the semiconductor device to engineer the far-field target in a faster manner and thus, improves the overall efficiency of the method.

In an embodiment, the second etching process is performed to alter a sidewall profile of the baseline mesa profile to define the requisite mesa angle for the requisite mesa profile while, substantially, retaining same depth for the requisite mesa profile as the predefined depth of the baseline mesa profile. Herein, the re-etching via the second etching process is performed to the sidewall profile of the baseline mesa profile to define the requisite mesa angle. The "sidewall profile" refers to a part of the mesa profile associated with the sides of the mesa structure, wherein the sidewall profile is defined by the mesa angle. Thus, the sidewall profile of the baseline mesa profile is altered to define the requisite mesa angle for the requisite mesa profile while, substantially, retaining the same depth for the requisite mesa profile as the predefined depth of the baseline mesa profile. In an exemplary scenario, the second etching process utilizing the ICP with the preselected second set of parameters comprises removal of the semiconductor substrate material to form the requisite mesa profile having a requisite mesa angle of 110° and a requisite depth of 1000 nm, from a baseline mesa profile and having a baseline mesa angle of 112° and a predefined depth of 1005 nm. Notably, the predefined depth is kept substantially constant i.e., may vary in the range of 0 to 50 nm with respect to the predefined depth to form the requisite depth and enable alteration of the sidewall profile in an efficient manner. For example, a predefined depth of 1010 nm may vary from 1010, 1009, 1008, 1005, 1000, 9990, 9975 up to 1005, 1000, 9990, 9975, 9960.

In an exemplary implementational scenario, the baseline mesa profile of 117° etched using the first etching process i.e., ICP-RIE process on the exposed region, utilizing inductively coupled plasma with preselected first set of parameters is re-etched using the second etching process on the etched region, utilizing the inductively coupled plasma with the preselected second set of parameters, to alter the baseline mesa profile having baseline mesa angle of 117° to the requisite mesa profile having the requisite mesa angle of 112°. The preselected second set of parameters comprising at least one of an ICP power, a RIE power and an operating pressure. The method beneficially varies the preselected second set of parameters based on the requirements of the implementation to efficiently etch the baseline mesa profile.

Optionally, the ICP power for the second etching process may vary from 150 watts to 1500 watts (W). In an example, the ICP power may be selected from the range of 250 W, 300 W, 350 W, 400 W, 500 W, 600 W, 650 W, 700 W up to 500 W, 550 W, 600 W, 650 W, 700 W, 800 W, 900 W, 1000 W, 1100 W, 1200 W, 1250 W.

Optionally, the RIE power for the second etching process may vary from 50 watts to 350 watts (W). In an example, the RIE power may be selected from the range of 50 W, 60 W, 75 W, 100 W, 150 W, 200 W, 250 W, 300 W up to 60 W, 75 W, 90 W, 100 W, 150 W, 200 W, 250 W, 300 W, 350 W.

Optionally, the operating pressure for the second etching process (i.e., higher than the operating pressure for the first etching process) may vary from 20 millitorrs to 100 millitorrs (mTorr). In an example, the operating pressure may be selected from the range of 20 mTorr, 25 mTorr, 30 mTorr, 35 mTorr, 40 mTorr, 45 mTorr, 50 mTorr up to 60 mTorr, 70 mTorr, 75 mTorr, 100 mTorr, 150 mTorr, 200 mTorr.

In an embodiment, the preselected first set of parameters comprises utilizing the inductively coupled plasma for the first etching process which is denser compared to the inductively coupled plasma utilized as part of the preselected second set of parameters for the second etching process. Notably, a denser plasma is generated via the ICP of the first etching process having the preselected first set of parameters in comparison to the plasma generated with the ICP of the second etching process having the preselected second set of parameters. Beneficially, the denser plasma is generated to enable etching i.e., removal of a majority of the semiconductor substrate material to form the baseline mesa profile with ease in a time-efficient manner and to further allow precise modifications to be made to the mesa profile using a rarer plasma generated using the preselected second set of parameters during re-etching via the second etching process in a quick and efficient manner.

In an embodiment, the preselected second set of parameters comprises a preselected etch time for the second etching process, a preselected reactive-ion etching (RIE) power for the inductively coupled plasma and are selected based on the requisite mesa angle. Herein, during retching via the second etching process to achieve the requisite mesa profile, the preselected second set of parameters comprises at least the preselected etch time and the preselected RIE power for the ICP system, to achieve the requisite mesa angle defining the requisite mesa profile. Beneficially, the etching time and etching power (or RIE power) of the ICP system are varied based on the requirements of the implementation to achieve the requisite mesa profile having the requisite mesa angle. Optionally, the etching time and etching power (or RIE power) of the ICP system are varied to achieve the requisite mesa profile having the requisite mesa angle and the requisite predefined depth. Beneficially, by adjusting or varying the pre-selected second set of parameters of the second etching process, namely the preselected etch time and the preselected etch (RIE) power, different types of lasers can be fabricated from the same baseline process. For example, when the same type of semiconductor substrate (or wafer) utilizing the same mesa photomask, and same plasma etching process is done for o the wafer, different products i.e., semiconductor devices or lasers can be obtained from the wafers by using different etch times and etch powers in the second etching process.

In an embodiment, the second etching process is an anisotropic etching process. That is, the plasma generated via the ICP system to etch the semiconductor substrate involves incidence of the generated plasma perpendicular to the etch surface and occurs in a singular direction. Generally, the anisotropic etching is used in the production of wafers for semiconductor technology and wherein the perpendicular anisotropic etching is employed carving out circuit patterns. Herein, the anisotropic second etching is achieved by using the reactive ion etching (RIE) process (or the ICP process) i.e., via placement of electrodes on either sides of the semiconductor substrate being etched; wherein, the reactive ions bombard the surface of the semiconductor substrate and thus, barraging the semiconductor substrate surface at substantially perpendicular angles. Such a configuration enables the second etching process to beneficially avoid the rounding of the etches being formed for example, during isotropic etching.

The method further comprises removing the mask layer. Upon forming the requisite mesa profile, the mask layer is removed from the mask layer to enable further fabrication thereof. Herein, the removal of the mask layer is performed to allow other material layers to deposited to improve the functioning of the semiconductor substrate and allow further fabrication thereof. The removal of the mask layer is done using a treatment (or development) process comprising at least one of a photoetching process (i.e., when the mask layer is a photomask layer) or a chemical etching process (i.e., when the mask layer is a hard mask layer).

The method further comprises defining a p-n junction for the semiconductor substrate. Upon removing the mask layer from the semiconductor substrate, the method further comprises defining the p-n junction for the semiconductor substrate, wherein the p-n junction enables formation of the p-n junction semiconductor device. The defined p-n junction is configured to emit coherent light using Light Amplification by Stimulated Emission of Radiation (or LASER), wherein all the emitted light waves have the same frequency and phase angle. The "p-n junction" refers to a junction of a p-n diode of the semiconductor device, wherein the "p-n junction diode" refers to a two-terminal or two-electrode semiconductor device, which allows flow of electric current in a single direction while blocking the electric current in an opposite or reverse direction. In an example, the p-n junction diode is made from the semiconductor materials such as silicon, germanium, and gallium arsenide. Typically, the defining of the p-n junction comprises separate formation of contact surfaces (i.e., p-contact and n-contact) for the interacting holes and carriers to enable flow of current thereat and thereby result in the formation of the semiconductor device.

In an embodiment, defining the p-n junction for the semiconductor substrate further comprises depositing an insulating layer over the semiconductor substrate, defining an opening in the insulating layer corresponding to a top area of the requisite mesa profile utilizing photolithography techniques, forming a p-contact at the top area of the requisite mesa profile and forming a n-contact on a backside of the semiconductor substrate. Herein, upon removal of the mask layer, the insulating layer is deposited over the entire semiconductor substrate. The term "insulating layer" refers to the dielectric material layer deposited over the mesa structure. Typically, the insulating layer refers to a dielectric electrical insulator configured to be polarized on application of an electric field (via the semiconductor device). Upon formation of the mesa structure on the semiconductor substrate i.e., once the ridges have been etched to the semiconductor substrate, the insulating layer may be deposited covering at least the top and sides of the mesa structure.

Generally, the insulating layer covers the entire semiconductor substrate (and not just the top and sides of the mesa structure) without any limitations. Such process of depositing the insulating layer may be part of the present method of fabricating a semiconductor device on a semiconductor substrate. The material for the insulating layer may be selected from at least one of porcelain or other ceramics, mica, glass, plastics, polymers and oxides of various metals and semiconductors. In an example, the insulating layer of silicon di-oxide ($SiO_2$) is deposited with a thickness of 300 nm. However, it will be appreciated that other suitable materials may be applied with different thickness without limiting the scope of the disclosure.

Generally, for single-mode RWG lasers, the width of the mesa structure or top of the mesa structure has to be narrow (~1-3 μm, depending on operating wavelength) to ensure the single-mode operation. In embodiments of the present disclosure, since the sides of the ridge are covered with the insulating material, this ensures proper gain-guiding with current, i.e., only top of the ridge is required to be uninsulated. That is, since only the top of the ridge is opened, with the contact surface is present on the top of the mesa structure or semiconductor device, the current driven through the semiconductor structure passes only through the ridge, ensuring proper lasing in case of, for example, the semiconductor device being the laser.

Additionally, in the present embodiment, defining the p-n junction further comprises defining an opening in the insulating layer corresponding to a top area of the requisite mesa profile utilizing photolithography techniques. The term "opening" refers to an etched region of the insulating layer exposing the top area (i.e., top of the mesa structure) of the requisite mesa profile of the semiconductor substrate using photolithography techniques. Typically, upon depositing the insulating layer on the whole wafer, defining the p-n junction further comprises defining the opening in the insulating layer corresponding to the top area by performing photolithographic steps for etching the top of the mesa structure (or ridge open) to define the opening and leaving the insulating layer to protect the part or portion of the requisite mesa profile (i.e., at the sides and the bottom region) where insulation is required.

Furthermore, in the present embodiment, defining the p-n junction also comprises forming the p-contact at the top area of the requisite mesa profile and the n-contact at the back side (or bottom side) of the semiconductor substrate. Herein, upon defining the opening in the insulating layer using photolithographic techniques, the formation of the p-contact at the top area of the requisite mesa profile and the formation of the n-contact at the back side or bottom area of the requisite mesa profile is implemented to together define the p-n junction of the semiconductor substrate. The term "contact" or contact surface refers to a metal junction formed on the top or bottom of the mesa structure. Generally, the contact surface is formed using a semiconductor and/or metallic material and comprises a low electrical resistance. The contact surface is formed based on the implementation and selected from at least one of ohmic contact, Schottky contact, tunnel contact, annealed and/or alloyed contact. In an example, the semiconductor substrate is etched back to leave the semiconductor device (such as a transistor) isolated from surrounding material to prevent formation of parasitic capacitance arising from electrical carriers travelling via the contact surface. Typically, the formation of the p-contact and the n-contact at the top area and the back side of the semiconductor substrate, respectively, is performed using conventional rapid thermal annealing techniques in addition to metal deposition techniques.

Optionally, defining the p-n junction further comprises depositing a metallic layer over the semiconductor substrate. Typically, prior to forming the contact surfaces on the semiconductor substrate, the method further comprises depositing the metallic layer covering at least the sides and the top of the requisite mesa profile of the mesa structure formed therein. Upon depositing the metallic layer, a second opening in the metallic layer is defined by treating the metallic layer via a treatment process such as, photoetching or chemical etching, responsive to the metallic layer material, wherein the opening exposes a portion of the insulating layer beneath thereof and thereby enables formation of the contact surfaces of the p-n junction using rapid thermal annealing techniques.

In an embodiment, the step of forming the n-contact further comprises heating the semiconductor substrate by rapid thermal annealing. Typically, the formation of the n-contact for defining the p-n junction of the semiconductor substrate further comprises rapid thermal annealing. The "rapid thermal annealing," also referred to as rapid thermal processing (or RTP), relates to a semiconductor manufacturing process configured for heating the semiconductor wafers to temperatures exceeding up to 1000° C. for a few seconds. In an example, the semiconductor wafers are annealed at temperatures ranging from 400° C. to 500° C.

In another example, the semiconductor wafers are annealed at temperatures ranging from 500° C. to 600° C. Further, during cooling the heated wafers, temperatures are brought down slowly and gradually to prevent dislocations and wafer breakage due to thermal shock. For example, such rapid thermal annealing is often attained by high intensity lamps or lasers used that enables the employment for a wide variety of applications in semiconductor manufacturing including dopant activation, thermal oxidation, metal reflow and chemical vapor deposition.

In an embodiment, prior to the step of forming the n-contact, the method comprises thinning the semiconductor substrate. That is, optionally, defining the p-n junction further comprises thinning of the semiconductor substrate. Herein, upon formation of the p-contact on the top area of the requisite mesa profile and prior to the formation of the n-contact at the back side, the method further comprises thinning of the semiconductor substrate up to a desired thickness to beneficially provide a slim and sleek configuration of the semiconductor substrate and/or device that provides improved target lasing properties. In an embodiment, the semiconductor substrate is thinned to about 200 micrometres. Herein, the semiconductor substrate may be thinned in the range of 150 micrometres (mm) to 250 micrometres. For example, the thickness of the wafer ranges from 150 mm, 151 mm, 152 mm, 154 mm, 155 mm, 160 mm, 170 mm, 180 mm, 190 mm, 200 mm up to 210 mm, 220 mm, 230 mm, 240 mm, and 250 mm.

In an embodiment, the method further comprises cleaving the semiconductor substrate to define bars and coating facets of the defined bars to form mirrors. Typically, physically localized weakness points of the semiconductor substrate are identified and thereby define cutting planes (or crystallographic planes) along which the bars are defined, wherein through an application of pressure, the semiconductor substrate is cleaved and thus separates the wafer or a portion thereof into individual laser bars. In an example, a slight application of pressure along the identified physically localized weakness points, such as via bending or cutting the semiconductor substrate over an edge (i.e., the cutting edge), causes the wafer to be cleaved into bars, wherein the cutting edge is perfectly aligned with the defined cutting planes to ensure clean and precise cleaved bars to be formed.

Further, upon formation of the defined bars, the method comprises coating facets of the defined bars to form mirrors therein. Typically, the output facets of the defined bars are coated such as, via a plasma deposition process to form the mirrors thereat. Notably, the coated are perfectly aligned and parallel with respect to each other to provide improved reflective properties and operational reliability of the fabricated semiconductor devices via the method. Beneficially, the coated mirrors provide a smooth and parallel configuration that improves the long term reliability and efficacy of the fabricated semiconductor devices.

In an embodiment, the method further comprises scribing chips off the off the formed mirrors (or the coated facets) to form chips and mounting the scribed chips on a chip mount to form the semiconductor device. The "chip mount" refers to a sub-mount configured to hold or support the scribed chips to form the semiconductor device. Since, the scribed chips have a low thickness and are relatively fragile, the chip mounts increases the structural integrity of the chips of the fabricated semiconductor device.

In another aspect, the present disclosure provides a semiconductor device adapted to provide desired lasing properties fabricated using any or all of the aforementioned embodiments of the method and beneficially includes all advantages of the method.

Modifications to embodiments of the present disclosure described in the foregoing are possible without departing from the scope of the present disclosure as defined by the accompanying claims. Expressions such as "including", "comprising", "incorporating", "have", "is" used to describe and claim the present disclosure are intended to be construed in a non-exclusive manner, namely allowing for items, components or elements not explicitly described also to be present. Reference to the singular is also to be construed to relate to the plural.

DETAILED DESCRIPTION OF THE DRAWINGS

Referring to FIG. 1, illustrated is a flowchart of a method 100 for fabricating a semiconductor device on a semiconductor substrate, wherein the semiconductor device is adapted to provide target lasing properties. As shown, the method 100 comprises steps 102, 104, 106, 108, and 110.

At step 102, the method 100 comprises creating a mask layer over the semiconductor substrate, the mask layer having at least one opening to expose a region of the semiconductor substrate. Typically, the mask layer or mask is created on top of the semiconductor substrate to cover the surface of semiconductor substrate, wherein the mask layer comprises at least one opening to expose a region (of the semiconductor substrate) to be etched.

At step 104, the method 100 comprises etching using a first etching process the exposed region, utilizing inductively coupled plasma with preselected first set of parameters to obtain a baseline mesa profile, the baseline mesa profile having a baseline mesa angle. Herein, the first etching process involves utilization of inductively coupled plasma (ICP) with the preselected first set of parameters to obtain base line mesa profile, wherein the plasma etching may be one of a dry etching or a wet etching process.

At step 106, the method 100 comprises re-etching using a second etching process the etched region, utilizing inductively coupled plasma with preselected second set of parameters, to alter the baseline mesa profile, the second set of parameters being different from the first preselected parameters, to obtain a requisite mesa profile having a requisite mesa angle defined by the target lasing properties and the requisite mesa angle being different from the baseline mesa angle. The re-etching of the semiconductor substrate is done to provide precise and accurate modifications to the baseline mesa profile and thus, alter the baseline mesa profile utilizing the inductively coupled plasma with the preselected second set of parameters to obtain the requisite mesa profile having the requisite mesa angle.

At step 108, the method 100 comprises removing the mask layer Upon obtaining the requisite mesa profile having the requisite mesa angle, the method 100 comprises removing the mask layer to enable further processing of the semiconductor substrate such as, application of additional material layers and treatment processes, to thereby enable fabrication of the semiconductor device.

And, at step 110, the method 100 comprises defining a p-n junction for the semiconductor substrate. That is, upon removing the mask layer, the method 100 comprises defining the p-n junction for the semiconductor substrate and thereby enabling further treatment and processing of the semiconductor substrate having the define p-n junction to form the improved semiconductor device.

Referring to FIGS. 2A to 2I, illustrated are cross-sectional illustrations of various stages 200A-200I involved in forming a semiconductor device on a semiconductor substrate 202, in accordance with various embodiments of the present disclosure. Also referring to FIGS. 3A-3I, illustrated are schematic planar top view illustrations of various stages 300A-300I (corresponding to the stages 200A-200I) involved in forming the semiconductor device on a semiconductor substrate, in accordance with various embodiments of the present disclosure. Notably, FIGS. 2A-2I and FIGS. 3A-3I should be read in conjunction or corresponding to each step of the method 100 of FIG. 1. Specifically, the step 102 of FIG. 1 corresponds to FIGS. 2A and 3A, the step 104 of FIG. 1 corresponds to FIGS. 2B and 3B, the step 106 of FIG. 1 corresponds to FIGS. 2C and 3C, the step 108 of FIG. 1 corresponds to FIGS. 2D and 3D, and the step 110 of FIG. 1 corresponds to FIGS. 2E to 2I and 3E to 3I, respectively.

Figure 2A:
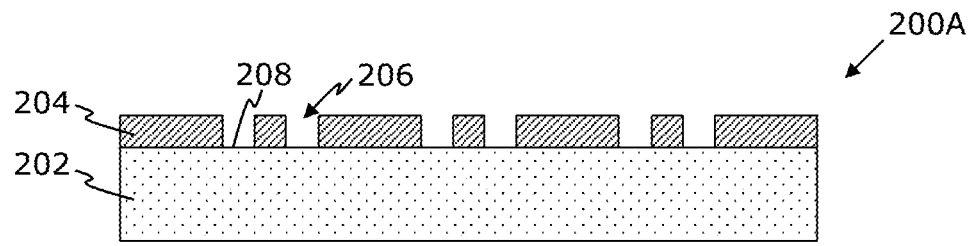
FIGS. 2A-2I are schematic cross-sectional illustrations of various stages involved in fabricating a semiconductor device on a semiconductor substrate, in accordance with various embodiments of the present disclosure.
Figure 3A:
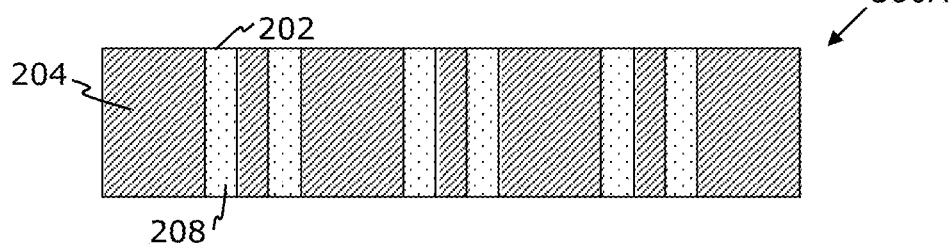
FIGS. 3A-3I are schematic planar top view illustrations of various stages involved in fabricating a semiconductor device on a semiconductor substrate, in accordance with various embodiments of the present disclosure.

Referring to FIGS. 2A and 3A, in combination, illustrated is a cross sectional view and a top view of stage 200A, 300A, respectively. As shown, at the stage 200A, 300A, a mask layer 204 is created over the semiconductor substrate 202, wherein the mask layer 204 having at least one opening 206 to expose a region 208 of the semiconductor substrate 202.

Figure 2B:
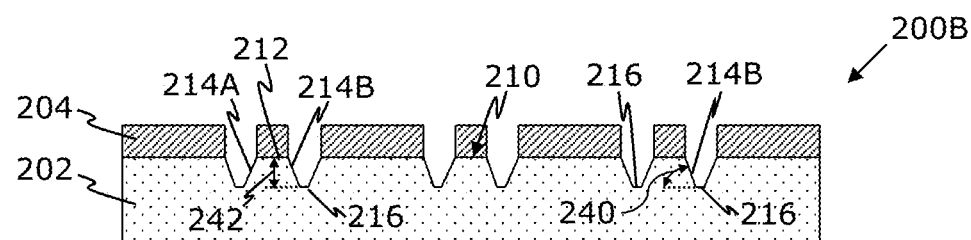
Figure 3B:
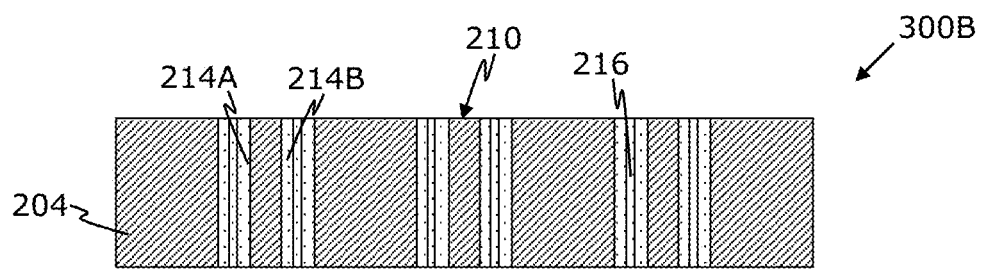

Referring to FIGS. 2B and 3B, in combination, illustrated is a cross sectional view and a top view of stage 200B, 300B, respectively. As shown, at the stage 200B, 300B, the exposed region 208 is etched using a first etching process, utilizing inductively coupled plasma with preselected first set of parameters to obtain a baseline mesa profile 210, the baseline mesa profile 210 having a baseline mesa angle. Typically, a mesa structure is formed upon etching via the first etching process the exposed region 208, having a first top 212 and first sides 214A, 214B. It will be appreciated that the sides 214A, 214B, are denoted as first sides 214A, 214B oriented with respect to the baseline mesa angle and alteration in the baseline mesa angle would result in the formation of new sides having a different mesa angle. Moreover, between any two consecutive first sides of adjacent mesa structures, a bottom region 216 is formed, wherein the angle between any of the first side 214A or 214B and the bottom region 216 defines the baseline mesa angle 240 of the baseline mesa profile 210. As mentioned above, the term "predefined depth" 242 refers to the thickness of the semiconductor substrate material removed from the semiconductor substrate i.e., the distance between the top of the mesa structure 212 and the exposed bottom region 216 formed upon utilization of the first etching process.

Figure 2C:
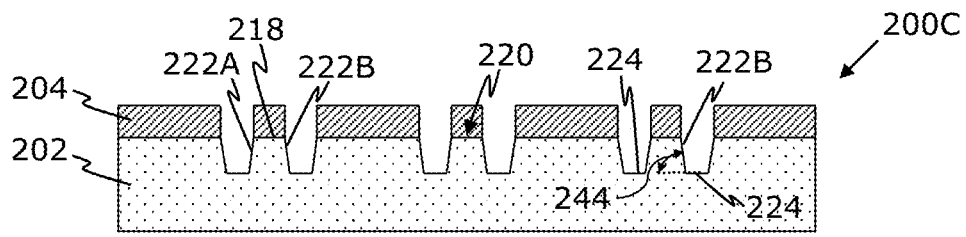
Figure 3C:
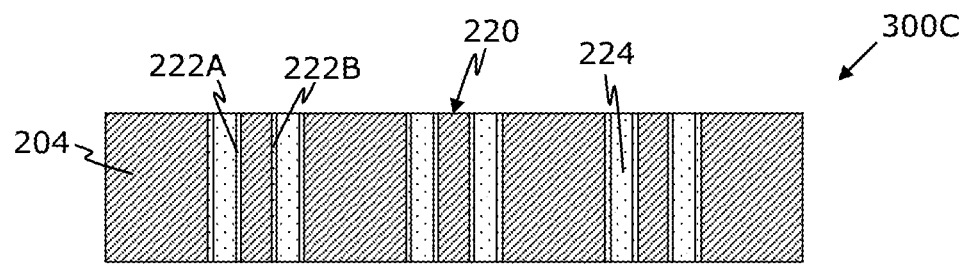

Referring to FIGS. 2C and 3C, in combination, illustrated is a cross sectional view and a top view of stage 200C, 300C, respectively. As shown, at the stage 200C, 300C, the etched region is re-etched using a second etching process, utilizing inductively coupled plasma with preselected second set of parameters, to alter the baseline mesa profile 210, the second set of parameters being different from the first preselected parameters, to obtain a requisite mesa profile 220 having a requisite mesa angle defined by the target lasing properties and the requisite mesa angle being different from the baseline mesa angle. Notably, as shown, the re-etching process reduces the baseline mesa angle to the requisite mesa angle. Typically, the mesa structure, having the baseline mesa profile 210, formed upon etching via the first etching process, comprising the top 212 and sides 214A, 214B (as shown in FIGS. 2B and 3B) is re-etched using the second etching process to form requisite mesa structure having the requisite mesa profile 220, wherein the requisite mesa structure comprises a second top 218 and second sides 222A and 222B. Notably, the requisite mesa angle is different or lesser than the baseline mesa angle. Moreover, between any two consecutive sides of adjacent mesa structures, a second bottom region 224 is formed, wherein the angle between any second side 222A or 222B and the bottom region 224 defines the requisite mesa angle 244 of the baseline mesa profile 220. Furthermore, the width of the second bottom region 224 formed is lesser than the width of the first bottom region 216.

Figure 2D:
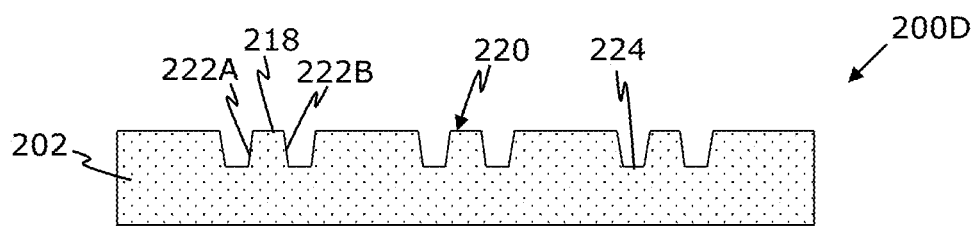
Figure 3D:
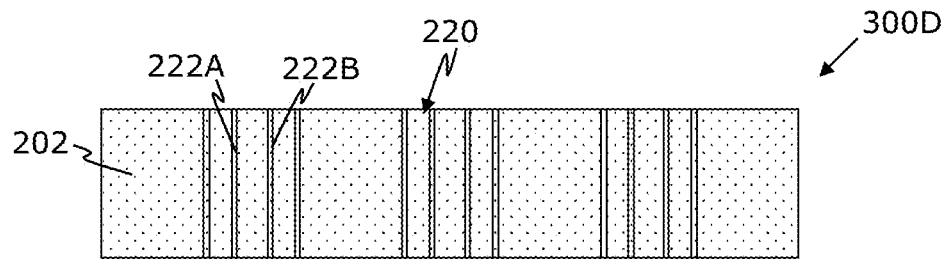

Referring to FIGS. 2D and 3D, in combination, illustrated is a cross sectional view and a top view of stage 200D, 300D, respectively. As shown, at the stage 200D, 300D, the mask layer 204 is removed to expose the semiconductor substrate 202 for further processing and treatment thereof and to enable further fabrication of the semiconductor device.

Figure 2E:
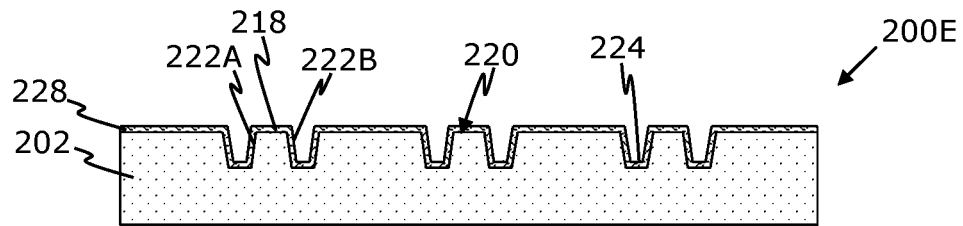
Figure 3E:
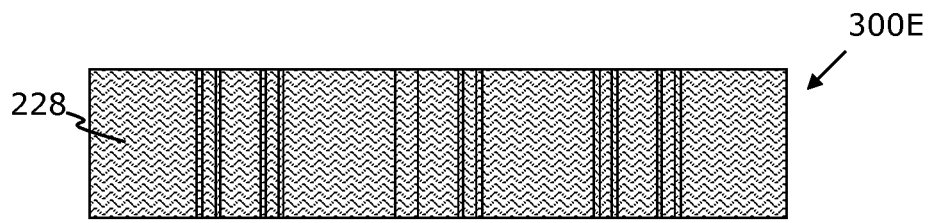

Referring to FIGS. 2E and 3E, in combination, illustrated is a cross sectional view and a top view of stage 200E, 300E, respectively. As shown, at the stage 200E, 300E, a p-n junction 226 (not shown in FIGS. 2E and 3E and shown in FIGS. 2I and 3I) is defined for the semiconductor substrate 202. As shown, at the stage 200E, 300E, defining the p-n junction 226 comprises depositing an insulating layer 228 over the semiconductor substrate 202.

Figure 2F:
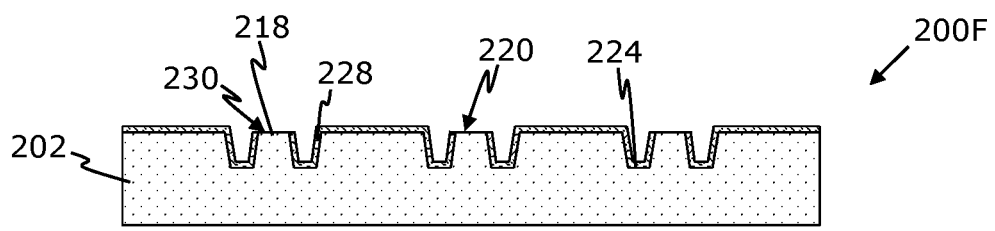
Figure 3F:
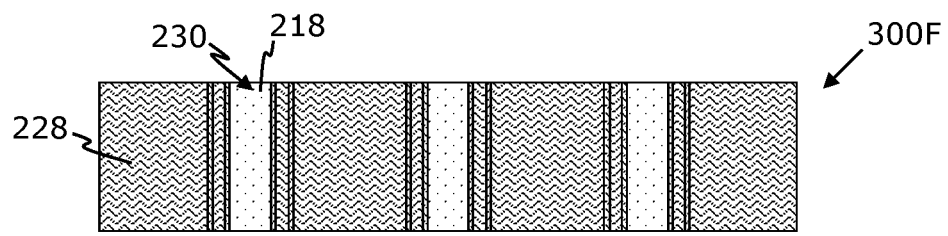

Referring to FIGS. 2F and 3F, in combination, illustrated is a cross sectional view and a top view of stage 200F, 300F, respectively. As shown, at the stage 200F, 300F, defining the p-n junction 226 (not shown in FIGS. 2F and 3F) for the semiconductor substrate 202 further comprises defining an opening 230 in the insulating layer 228 corresponding to the top area 218 of the requisite mesa profile 220 utilizing photolithography techniques.

Figure 2G:
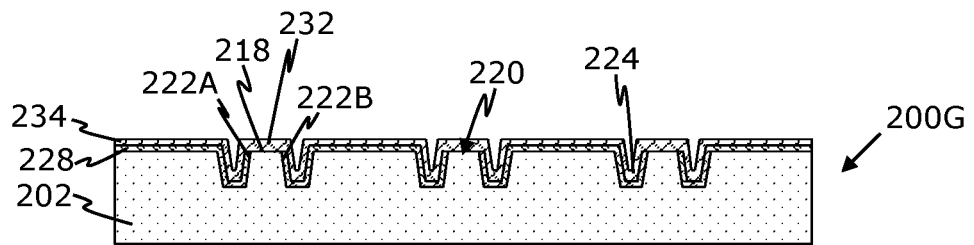
Figure 3G:
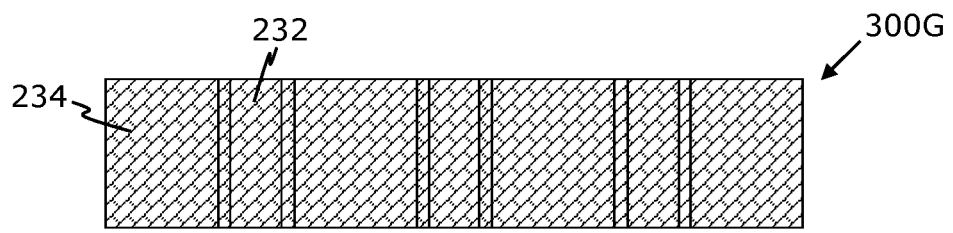

Referring to FIGS. 2G and 3G, in combination, illustrated is a cross sectional view and a top view of stage 200G, 300G, respectively. As shown, at the stage 200G, 300G, defining the p-n junction 226 (not shown in FIGS. 2G and 3G) for the semiconductor substrate 202 further comprises forming a p-contact 232 at the top area 218 of the requisite mesa profile 220. Moreover, a metallic layer 234 is deposited on semiconductor substrate over the insulating layer prior to defining the p-contact 232 of the p-n junction 226.

Figure 2H:
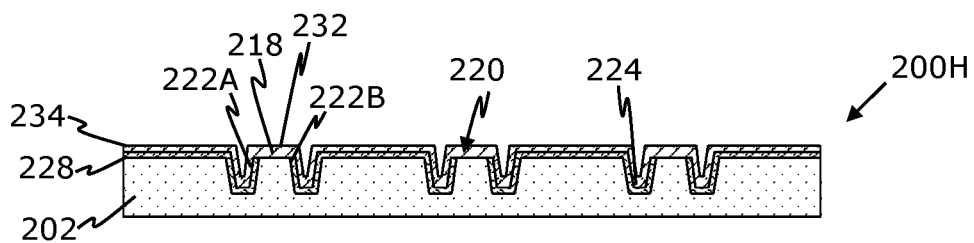
Figure 3H:
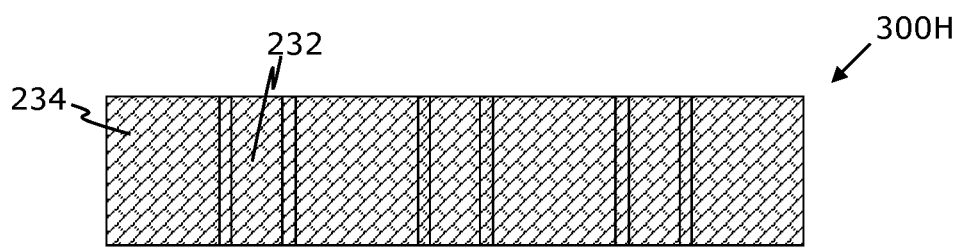

Referring to FIGS. 2H and 3H, in combination, illustrated is a cross sectional view and a top view of stage 200H, 300H, respectively. As shown, at stage 200H, 300H, defining the p-n junction 226 (not shown in FIGS. 2H and 3H) for the semiconductor substrate 202 further comprises thinning of the semiconductor substrate 202. Typically, the thickness of the semiconductor substrate 202 is reduced by removing the unwanted semiconductor substrate material thereat to provide a sleek and slim configuration of the semiconductor substrate 202 having an improved efficacy and output.

Figure 2I:
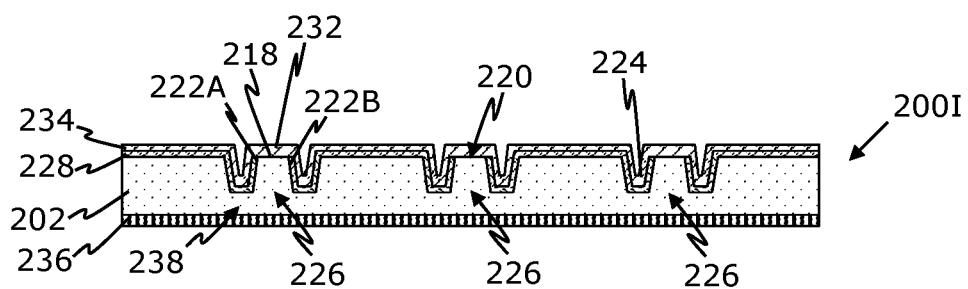
Figure 3I:
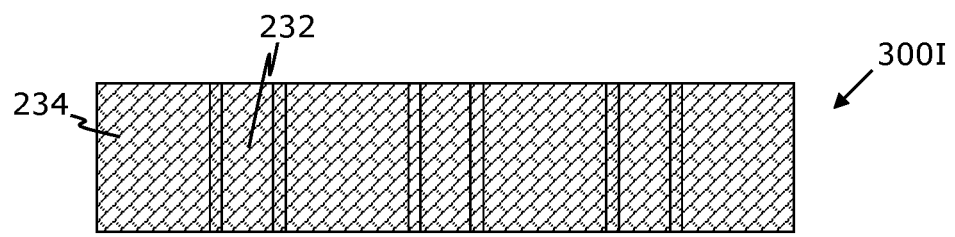

Referring to FIGS. 2I and 3I, in combination, illustrated is a cross sectional view and a top view of stage 200I, 300I, respectively. As shown, at the stage 200I, 300I, defining the p-n junction 226 further comprises forming a n-contact 236 on a backside 238 of the semiconductor substrate 202. Herein, the formation of the n-contact 236 is performed using a rapid thermal annealing technique and may also employ addition of another metallic layer 234 thereat.

Figure 4:
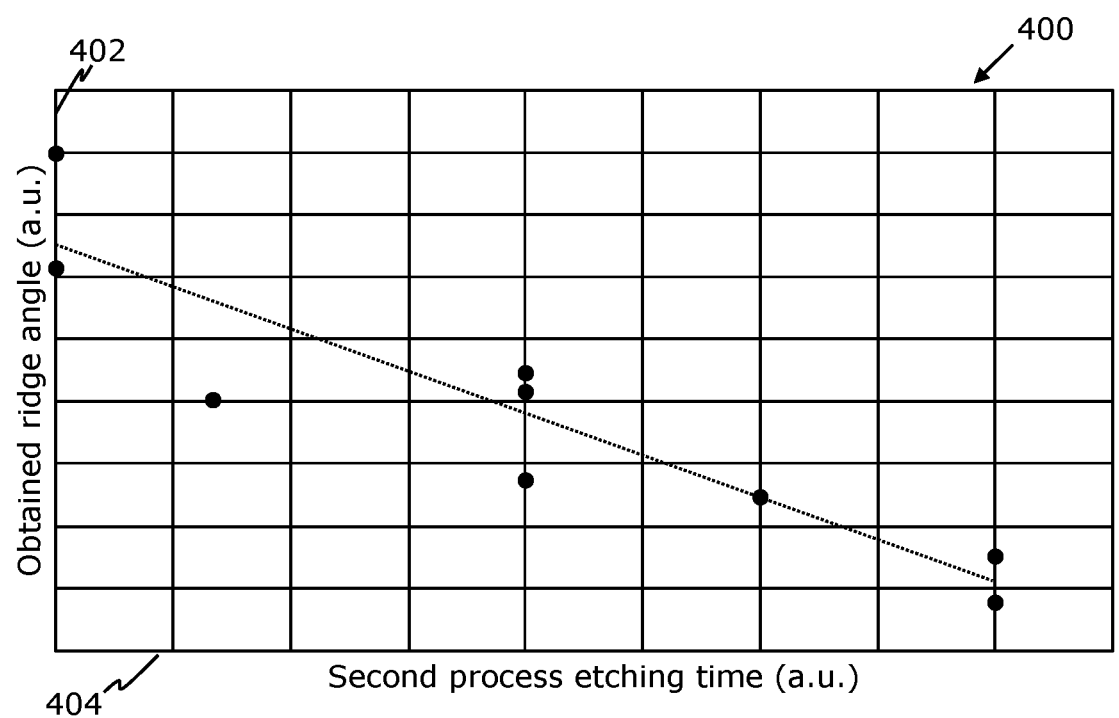
FIG. 4 is a graph illustration depicting relationship between the obtained ridge angle and the second etching process time for the semiconductor device, in accordance with an embodiment of the present disclosure.

Referring to FIG. 4, illustrated is a graph 400 depicting relationship between the obtained ridge angle and the second etching process time. As shown, the graph 400 has y-axis 402 representing the obtained ridge angle or the requisite mesa angle of the requisite mesa profile 220 and x-axis 404 representing the etch time of the second etching process. As shown, the requisite mesa angle follows an inverse relation with the etch time of the second etching process i.e., with an increase in the requisite mesa angle, the second etching time is reduced and vice versa. The graph 400 enables design of wider nominal ridge widths that does not require very precise processing and enables usage of masks having lower tolerances, and wherein by altering the mesa angle, an optimum performance of the method 100 can be achieved. Additionally, lower series resistances are obtained on account of wider ridge widths, and in processing, larger tolerances can be tolerated as a result.

The invention claimed is:

1. A method for fabricating a semiconductor device on a semiconductor substrate, the method comprising:
    creating, a mask layer over the semiconductor substrate, the mask layer having at least one opening to expose a region of the semiconductor substrate;
    etching the exposed region using a first etching process utilizing inductively coupled plasma with a preselected first set of parameters to obtain a baseline mesa profile, the baseline mesa profile having a baseline mesa angle;
    re-etching the etched region using a second etching process utilizing inductively coupled plasma with preselected second set of parameters, to alter the baseline mesa profile, the second set of parameters being different from the first preselected parameters, to obtain a requisite mesa profile having a requisite mesa angle different from the baseline mesa angle;
    removing the mask layer; and
    defining a p-n junction for the semiconductor substrate,
    wherein the preselected first set of parameters comprises utilizing the inductively coupled plasma for the first etching process which is denser compared to the inductively coupled plasma utilized as part of the preselected second set of parameters for the second etching process.

2. The method according to claim 1, wherein the preselected second set of parameters comprises a preselected etch time for the second etching process, a preselected reactive-ion etching (RIE) power for the inductively coupled plasma and are selected based on the requisite mesa angle.

3. The method according to claim 1, wherein the second etching process is an anisotropic etching process.

4. The method according to claim 1, wherein the mask layer is one of a photoresist mask layer or a hard mask layer.

5. The method according to claim 1, wherein the preselected first set of parameters are selected based, at least in part, to obtain the baseline mesa profile having a predefined depth.

6. The method according to claim 5, wherein the second etching process is performed to alter a sidewall profile of the baseline mesa profile to define the requisite mesa angle for the requisite mesa profile while, substantially, retaining same depth for the requisite mesa profile as the predefined depth of the baseline mesa profile.

7. The method according to claim 1, wherein defining the p-n junction for the semiconductor substrate further comprises:
    depositing an insulating layer over the semiconductor substrate;
    defining an opening in the insulating layer corresponding to a top area of the requisite mesa profile utilizing photolithography techniques;
    forming a p-contact at the top area of the requisite mesa profile; and
    forming a n-contact on a backside of the semiconductor substrate.

8. The method according to claim 7, wherein the step of forming the n-contact further comprises heating the semiconductor substrate by rapid thermal annealing.

9. The method according to claim 7, wherein prior to the step of forming the n-contact, the method comprises thinning the semiconductor substrate.

10. The method according to claim 9, wherein the semiconductor substrate is thinned to about 200 micrometres.

11. The method according to claim 7 further comprising:
    cleaving the semiconductor substrate to define bars; and
    coating facets of the defined bars to form mirrors.

12. The method according to claim 11 further comprising:
    scribing chips off the formed mirrors; and
    mounting the scribed chips to form the semiconductor device.

13. A semiconductor device comprising a p-n junction on a semiconductor substrate, the semiconductor device fabricated by:
    creating a mask layer over the semiconductor substrate, the mask layer having at least one opening to expose a region of the semiconductor substrate;
    etching the exposed region using a first etching process utilizing inductively coupled plasma with a preselected first set of parameters to obtain a baseline mesa profile, the baseline mesa profile having a baseline mesa angle;
    re-etching the etched region using a second etching process utilizing inductively coupled plasma with a preselected second set of parameters, to alter the baseline mesa profile, the second set of parameters being different from the first preselected parameters, to obtain a requisite mesa profile having a requisite mesa angle different from the baseline mesa angle;
    removing the mask layer; and
    defining a p-n junction for the semiconductor substrate,
    wherein the preselected first set of parameters comprises utilizing the inductively coupled plasma for the first etching process which is denser compared to the inductively coupled plasma utilized as part of the preselected second set of parameters for the second etching process.

14. The semiconductor device according to claim 13, wherein the semiconductor device is a laser device.

* * * * *